United States Patent [19]

Sawada et al.

[11] Patent Number: 5,396,124
[45] Date of Patent: Mar. 7, 1995

[54] CIRCUIT REDUNDANCY HAVING A VARIABLE IMPEDANCE CIRCUIT

[75] Inventors: Akihiro Sawada; Hiroyuki Yamauchi, both of Osaka, Japan

[73] Assignee: Matsushita Electric Industrial Co., Ltd., Kadoma, Japan

[21] Appl. No.: 128,726

[22] Filed: Sep. 30, 1993

[30] Foreign Application Priority Data

Sep. 30, 1992 [JP] Japan .................. 4-261144

[51] Int. Cl.⁶ .......................................... H03K 19/003
[52] U.S. Cl. ...................................... 326/13; 365/200; 326/21
[58] Field of Search ............... 307/441, 443, 449, 494; 365/200, 230.03

[56] References Cited

U.S. PATENT DOCUMENTS

| | | | |
|---|---|---|---|
| 4,538,032 | 8/1985 | Ballatore et al. | 379/398 |
| 5,140,189 | 8/1992 | Brewer | 307/441 |
| 5,140,622 | 8/1992 | Shino et al. | 377/20 |
| 5,249,225 | 9/1993 | Williams | 379/404 |
| 5,264,744 | 11/1993 | Mizukami et al. | 307/443 X |
| 5,294,845 | 3/1994 | McMahan et al | 307/443 |
| 5,295,114 | 3/1994 | Kobayashi | 365/200 X |
| 5,315,552 | 5/1994 | Yoneda | 365/200 |
| 5,343,429 | 8/1994 | Nakayama et al. | 365/200 |

FOREIGN PATENT DOCUMENTS 2-21500 1/1990 Japan .

OTHER PUBLICATIONS

K. Sasaki et al., "A 9 ns 1 Mb CMOS SRAM", ISSCC Digest of Technical Papers, pp. 34–35 (1989).

Primary Examiner—David R. Hudspeth
Attorney, Agent, or Firm—Willian Brinks Hofer Gilson & Lione

[57] ABSTRACT

In a semiconductor memory having a redundant circuit, a plurality of first normal cells and a plurality of first spare cells are connected to a first pair of data lines, and a plurality of second normal cells and a plurality of second spare cells are connected to a second pair of data lines. Both pairs of data lines are connected to an output data line through a selecting amplifier. A normal cell is selected based on a combination of NGWL1, NGWL2, ... with BLK1, BLK2, both NGWL1, NGWL2, ... and BLK1, BLK2 being supplied from a decoder, and a spare cell is selected based on a combination of the BLK1, BLK2 supplied from the decoder with SGWL1, SGWL2, ... supplied from a redundancy judging circuit. A second spare cell is selected when a first normal cell is selected, and a first spare cell is selected when a second normal cell is selected. Only at the time when a spare address is entered, one of the SGWL1, SGWL2, ... is raised. This not only achieves a high-speed reading and a high defect-relief rate, but also reduces the current consumption and the chip area.

9 Claims, 14 Drawing Sheets

CIRCUIT REDUNDANCY HAVING A VARIABLE IMPEDANCE CIRCUIT

BACKGROUND OF THE INVENTION

The present invention relates to a semiconductor integrated circuit such as a microprocessor, a semiconductor memory having a redundant circuit, or the like.

In an integrated semiconductor memory such as a mass SRAM (static RAM), a mass DRAM (dynamic RAM) or the like, there are disposed spare cells in addition to normal memory cells (normal cells) in order to relieve defective cells if any. "A 9 ns 1 Mb CMOS SRAM", ISSCC Digest of Technical Papers, pp 34–35, 1989 by K. Sasaki et al. or Japanese Laid-Open Publication No. 2-21500 discloses a spare cell reading method shown in FIGS. 15 and 16.

FIG. 15 is a circuit diagram showing the arrangement of a reading circuit portion in a conventional SRAM. In the arrangement shown in FIG. 15, the memory cells are divided into two blocks, i.e., a first cell array in which n-piece first normal cells 11.1, 11.2, . . . and one first spare cell 21 are connected to a first pair of data lines 31, and a second cell array in which n-piece second normal cells 12.1, 12.2, . . . and one second spare cell 22 are connected to a second pair of data lines 32. Normal word lines 35.1, 35.2, 35.3, 35.4, . . . are disposed for selecting one of 2 n-piece normal cells 11.$h$, 12.$h$ ($h=1$ to n), and spare word lines 37.1, 37.2 are disposed for selecting one of the two spare cells 21, 22.

There is also disposed a decoder 41 for receiving an address. Connected to the decoder 41 are (i) n-piece normal global word lines 33.1, 33.2, . . . the voltage of one of which is raised to a high level in response to an input address, (ii) one spare global word line 36 of which voltage is raised to a high level simultaneously with the one normal global word line above-mentioned, and (iii) first and second block selecting lines 34a, 34b for selecting the cell arrays. In the following description, signals on the n-piece normal global word lines 33.1, 33.2, . . . are respectively designated as NGWL1, NGWL2, . . . , signals on the 2 n-piece normal word lines 35.1, 35.2, 35.3, 35.4, . . . are respectively designated as NWL1, NWL2, NWL3, NWL4, . . . , a signal on the spare global word line 36 is designated as SGWL, signals on the two spare word lines 37.1, 37.2 are respectively designated as SWL1, SWL2, and signals on the first and second block selecting lines 34a, 34b are designated as BLK1, BLK2.

2 n-Piece AND circuits 42.1, 42.2, 42.3, 42.4, . . . are disposed for raising one of the NWLi ($i=1$ to 2 n) to a high level. Of these, n-piece AND circuits 42.1, 42.3, . . . corresponding to i which is an odd number, are disposed for selecting one of the n-piece first normal cells 11.1, 11.2, . . . in response to NGWLh ($h=1$ to n) and the BLK1, and n-piece AND circuits 42.2, 42.4, . . . corresponding to i which is an even number, are disposed for selecting one of the n-piece second normal cells 12.1, 12.2, . . . in response to NGWLh ($h=1$ to n) and the BLK2. AND circuits 44.1, 44.2 are disposed for respectively raising the SWL1 and the SWL2 to high levels. One AND circuit 44.1 is adapted to select the second spare cell 22 in response to the SGWL and the BLK1, and the other AND circuit 44.2 is adapted to select the first spare cell 21 in response to the SGWL and the BLK2. More specifically, when the BLK1 becomes a high level or a logical value 1 (the BLK2 becomes a low level or a logical value 0) and information on one of the first normal cells 11.1, 11.2, . . . is read out onto the first pair of data lines 31, information on the second spare cell 22 is read out onto the second pair of data lines 32. When the BLK2 becomes equal to 1 (the BLK1 is equal to 0) and information on one of the second normal cells 12.1, 12.2, . . . is read out onto the second pair of data lines 32, information on the first spare cell 21 is read out onto the first pair of data lines 31. Information on the first pair of data lines 31 is entered into a first sense amplifier 46.1, and information on the second pair of data lines 32 is entered into a second sense amplifier 46.2.

The first spare cell 21 serves as a substitute cell for the second normal cells 12.1, 12.2, . . . , and the second spare cell 22 serves as a substitute cell for the first normal cells 11.1, 11.2, . . . . A spare address comparing circuit 91 is adapted to judge whether or not a plurality of previously stored or programmed spare addresses contain an address identical with the input address. In the affirmative, it is required to select the first or second spare cell 21, 22 as a substitute cell. In the negative, the input address is called a normal address, requiring no substitute cell. To control the foregoing, the spare address comparing circuit 91 is arranged such that a redundancy judging signal SPARE on an output signal line 92 is set to 1 when a spare address is entered, and that the SPARE is set to 0 when a normal address is entered. When the SPARE is equal to 0, a redundancy judging switch 93 is adapted to supply the BLK1 to the first sense amplifier 46.1 and the BLK2 to the second sense amplifier 46.2, thus activating one sense amplifier 46.1 or 46.2. On the other hand, when the SPARE is equal to 1, the redundancy judging switch 93 is adapted to supply the BLK1 to the second sense amplifier 46.2 and the BLK2 to the first sense amplifier 46.1, thus activating the other sense amplifier 46.2 or 46.1.

According to the arrangement above-mentioned, information of one of the first and second normal cells 11.$h$, 12.$h$ ($h=1$ to n) is read out onto an output data line 39 when a normal address is entered, and information of the first or second spare cell 21 or 22 is read out onto the output data line 39 when a spare address is entered. The foregoing is shown in FIG. 16. More specifically, FIG. 16 shows an example where the second normal cell 12.1 selected by the NWL2 is accessed subsequently to the access to the first normal cell 11.1 selected by the NWL1.

First, the NGWL1, the BLK1 and the SGWL are raised by the decoder 41. This causes the NWL1 to be raised to a high level through the AND circuit 42.1 to select the first normal cell 11.1. Simultaneously, the SWL1 is raised to a high level through the AND circuit 44.1 to select the second spare cell 22. At this time, when the input address is a normal address, the SPARE becomes equal to 0. Accordingly, the first sense amplifier 46.1 is activated, causing information of the first normal cell 11.1 to be read out through the first pair of data lines 31. On the other hand, when the input address given for accessing to the first normal cell 11.1, is a spare address, the SPARE becomes equal to 1. Accordingly, the second sense amplifier 46.2 is activated, so that information of the second spare cell 22 instead of the first normal cell 11.1 which is defective, is read out through the second pair of data lines 32. If the second normal cell 12.1 is defective, the first spare cell 21 is used as a substitute cell in a similar manner.

The arrangement in FIG. 15 is adapted such that, in order to read a spare cell at a high speed, one of the NGWL1, NGWL2, . . . and the SGWL are simultaneously raised to high levels before it is judged whether or not the input address is a spare address. However, only one defective cell can be relieved for each cell array, resulting in low defect-relief rate. Japanese Patent Laid-Open Publication No. 2-21500 discloses an arrangement in which a plurality of defective cells in one cell array can be relieved. According to this arrangement, the memory cells are divided into, for example, four blocks (first to fourth cell arrays). It is now supposed that each cell array has n-piece normal cells and three spare cells. By using three spare global word lines and four block selecting lines, there are utilized (i) one spare cell in each of the second to fourth cell arrays as a substitute cell for the first cell array, (ii) one spare cell in each of the third, fourth and first cell arrays as a substitute cell for the second cell array, (iii) one spare cell in each of the fourth, first and second cell arrays as a substitute cell for the third cell array, and (iv) one spare cell in each of the first to third cell arrays as a substitute cell for the fourth cell array. One sense amplifier is prepared for each cell array, and all the voltages of three spare global word lines are raised to high levels simultaneously with the voltage of one of n-piece normal global word lines, regardless of the input address which is a normal address or a spare address.

According to the conventional arrangement above-mentioned in which the defect relief rate is improved, even though the input address is a normal address, it is required that each time an input address is given, there are raised, to high levels, all the voltages of a plurality of spare global word lines in addition to one of the n-piece normal global word lines. This disadvantageously increases the current consumption.

Further, it is required to dispose a plurality of block selecting lines (four lines in the arrangement above-mentioned) in each cell array. This increases the wiring area, causing the chip area to be disadvantageously increased. With an increase in the number of cells which can be relieved in one cell array, the number of block selecting lines passing in each cell array, is increased. This further increases the chip area. Further, it is required to dispose one sense amplifier for each cell array. This also increases the chip area.

When the chip area is increased as a semiconductor memory is increased in capacity, this increases the wiring length of an output signal line for transmitting a redundancy judging signal between the spare address comparing circuit and the redundancy judging switch. This causes the wiring capacitance to be increased, thus provoking a problem of signal delay. Likewise, other conventional semiconductor integrated circuit such as a microprocessor or the like, presents such a problem of signal delay due to wiring capacitance.

DISCLOSURE OF THE INVENTION

It is a first object of the present invention to provide a semiconductor memory having a redundant circuit which can not only achieve a high-speed reading of a memory cell and a high defect-relief rate, but also reduce the current consumption and the chip area.

It is a second object of the present invention to provide a semiconductor integrated circuit in which an influence of wiring capacitance is reduced to enable a signal to be transmitted at a high speed.

To achieve the first object, the present invention is arranged such that (i) there are disposed, in each of adjacent two cell arrays, a plurality of spare cells for the counter cell array, (ii) two block selecting lines are disposed such that, when a normal cell in one of the cell arrays is selected, a spare cell in the other cell array is selected, (iii) the selection of a normal cell and the selection of a spare cell are simultaneously executed, (iv) a spare cell is accessed only when the input address is a spare address, and (v) one amplifier is commonly used for both cell arrays.

To achieve the second object, the present invention is arranged such that (i) there is generated a difference between output impedances to two complementary-signal transmitting lines, (ii) there is generated and detected a difference in current between the two complementary-signal transmitting lines according to the output impedance difference, and (iii) the current difference thus detected is converted into a potential difference, based on which signal transmission in the semiconductor integrated circuit is achieved.

PREFERRED EMBODIMENTS

The following description will discuss five semiconductor integrated circuits according to embodiments of the present invention.

First Embodiment

Figure 1:
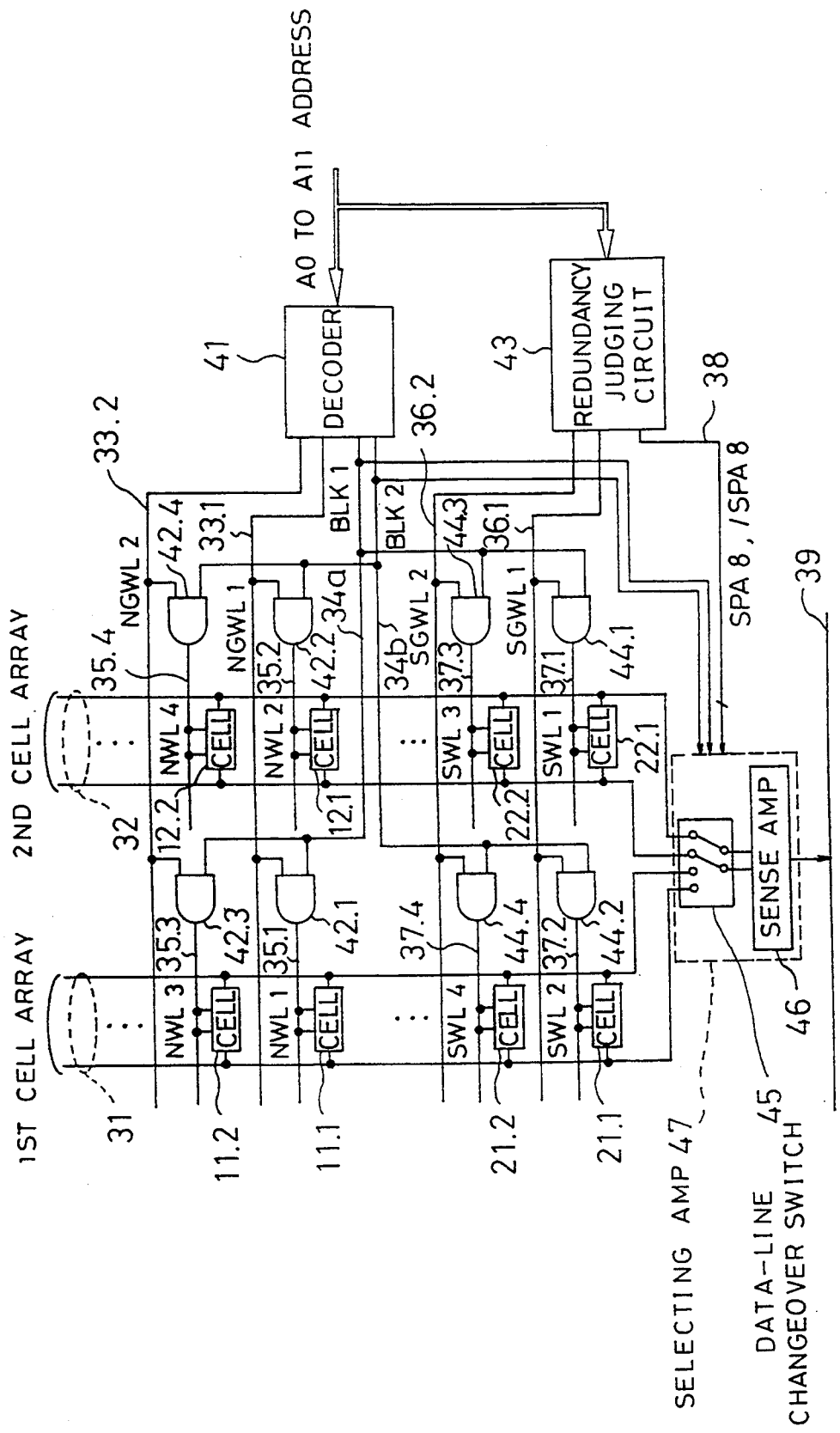
FIG. 1 is a circuit diagram illustrating the arrangement of a reading circuit portion in an SRAM serving as a semiconductor integrated circuit according to a first embodiment of the present invention.

FIG. 1 is a circuit diagram illustrating the arrangement of a reading circuit portion of an SRAM serving as a semiconductor integrated circuit according to a first embodiment of the present invention. In the arrangement shown in FIG. 1, it is premised that an address having 12 bits of A0 to A11 is entered, and that the memory cells are divided into 16 blocks. In FIG. 1, only two adjacent blocks are shown as first and second cell arrays, and other blocks are not shown. The relation between third and fourth cell arrays (not shown) is similar to the relation between the first and second cell arrays in FIG. 1. The foregoing is also applied to other cell arrays. Each of the memory cells is of the TFT type or high resistance type having a flip-flop.

In FIG. 1, the first cell array comprises n-piece (which is equal to 256) first normal cells 11.1, 11.2, ... commonly connected to a first pair of data lines 31, and m-piece (which is not less than 2) first spare cells 21.1, 21.2, .... Likewise, a second cell array comprises n-piece second normal cells 12.1, 12.2, ... commonly connected to a second pair of data lines 32, and m-piece second spare cells 22.1, 22.2, .... Normal word lines 35.1, 35.2, 35.3, 35.4, ... are disposed for selecting one of 2 n-piece normal cells 11.h, 12.h (h=1 to n). Spare word lines 37.1, 37.2, 37.3, 37.4, ... are disposed for selecting one of 2 m-piece spare cells 21.j, 22.j (j=1 to m).

There is also disposed a decoder 41 for receiving an address having 12 bits of A0 to A11. Connected to the decoder 41 are (i) n-piece normal global word lines 33.1, 33.2, ... the voltage of one of which is raised to a high level in response to an input address, and (ii) first and second block selecting lines 34a, 34b each for selecting a cell array. A redundancy judging circuit unit 43 is adapted to receive an address having 12 bits of A0 to A11. Connected to the redundancy judging circuit 43 are (i) m-piece spare global word lines 36.1, 36.2, ... the voltage of one of which is raised to a high level only when the input address is a spare address, and (ii) a data-line changeover signal line 38.

In the following description, signals on the n-piece normal global word lines 33.1, 33.2, ... are respectively designated as NGWL1, NGWL2, ..., signals on the 2 n-piece normal word lines 35.1, 35.2, 35.3, 35.4, ... are respectively designated as NWL1, NWL2, NWL3, NWL4, ..., signals on the m-piece spare global word lines 36.1, 36.2, ... are respectively designated as SGWL1, SGWL2, ... signals on the 2 m-piece spare word lines 37.1, 37.2, 37.3, 37.4, ... are respectively designated as SWL1, SWL2, SWL3, SWL4, ... and signals on the first and second block selecting lines 34a, 34b are respectively designated as BLK1, BLK2. The decoder 41 is adapted to supply, in addition to the BLK1 and BLK2, BLK3 to BLK16 for selecting the third to sixteenth cell arrays, but the BLK3 to the BLK16 are not shown in FIG. 1. One of these block selecting signals BLK1 to BLK16 is adapted to be asserted according to the result obtained by decoding, for example, the upper four bits A8 to A11 of an input address having 12 bits of A0 to A11. In particular, the first block selecting signal BLK1 becomes a high level when each of A8 to A11 is equal to 0, and the second block selecting signal BLK2 becomes a high level when only one bit A8 out of A8 to A11, is equal to 0. The lower eight bits A0 to A7 are decoded and become NGWL1, NGWL2, .... The data-line changeover signal line 38 comprises two complementary-signal transmitting lines. Signals SPA8, /SPA8 on the complementary-signal transmitting lines are generated by the redundancy judging circuit unit 43 based on the specific bit A8 out of the input address having 12 bits of A0 to A11.

2 n-Piece AND circuits 42.1, 42.2, 42.3, 42.4, ... are disposed for raising one of NWLi (i=1 to 2 n) to a high level. Of these, n-piece AND circuits 42.1, 42.3, ... corresponding to i which is an odd number, are adapted to select one of the n-piece first normal cells 11.1, 11.2, ... in response to NGWLh (h=1 to n) and the BLK1, and n-piece AND circuits 42.2, 42.4, ... corresponding to i which is an even number, are disposed for selecting one of the n-piece second normal cells 12.1, 12.2, ... in response to the NGWLh (h=1 to n) and the BLK2. Likewise, 2 m-piece AND circuits 44.1, 44.2, 44.3, 44.4, ... are disposed for raising one of SWLk (k=1 to 2 m) to a high level. Of these, m-piece AND circuits 44.1, 44.3, ... corresponding to k which is an odd number, are adapted to select one of the m-piece second spare cells 22.1, 22.2, ... in response to SGWLj (j=1 to m) and the BLK1, and m-piece AND circuits 44.2, 44.4, ... is adapted to select one of the m-piece first spare cells 21.1, 21.2, ... in response to SGWLj (j=1 to m) and the BLK2. More specifically, when the BLK1 becomes a high level or a logical value 1 (the BLK2 becomes a low level or a logical value 0) and information of one of the first normal cells 11.1, 11.2, ... is read out onto the first pair of data lines 31, information of one of the second spare cells 22.1, 22.2, ... is read out onto the second pair of data lines 32. When the BLK2 becomes equal to 1 (the BLK1 becomes equal to 0) and information of one of the second normal cells 12.1, 12.2, ... is read out onto the second pair of data lines 32, information of one of the first spare cells 21.1, 21.2, ... is read out onto the first pair of data lines 31.

There is disposed an output data line 39, to which information on the first pair of data lines 31 or information on the second pair of data lines 32 is supplied through a selecting amplifier 47. When the block selecting signal BLK1 or BLK2 is entered to the selecting amplifier 47 from the decoder 41, the changeover of the selecting amplifier 47 is controlled by the data-line changeover signals SPA8, /SPA8 from the redundancy judging circuit unit 43. As will be discussed in detail, the selecting amplifier 47 has a data-line changeover switch 45 and a single sense amplifier 46.

Figure 2:
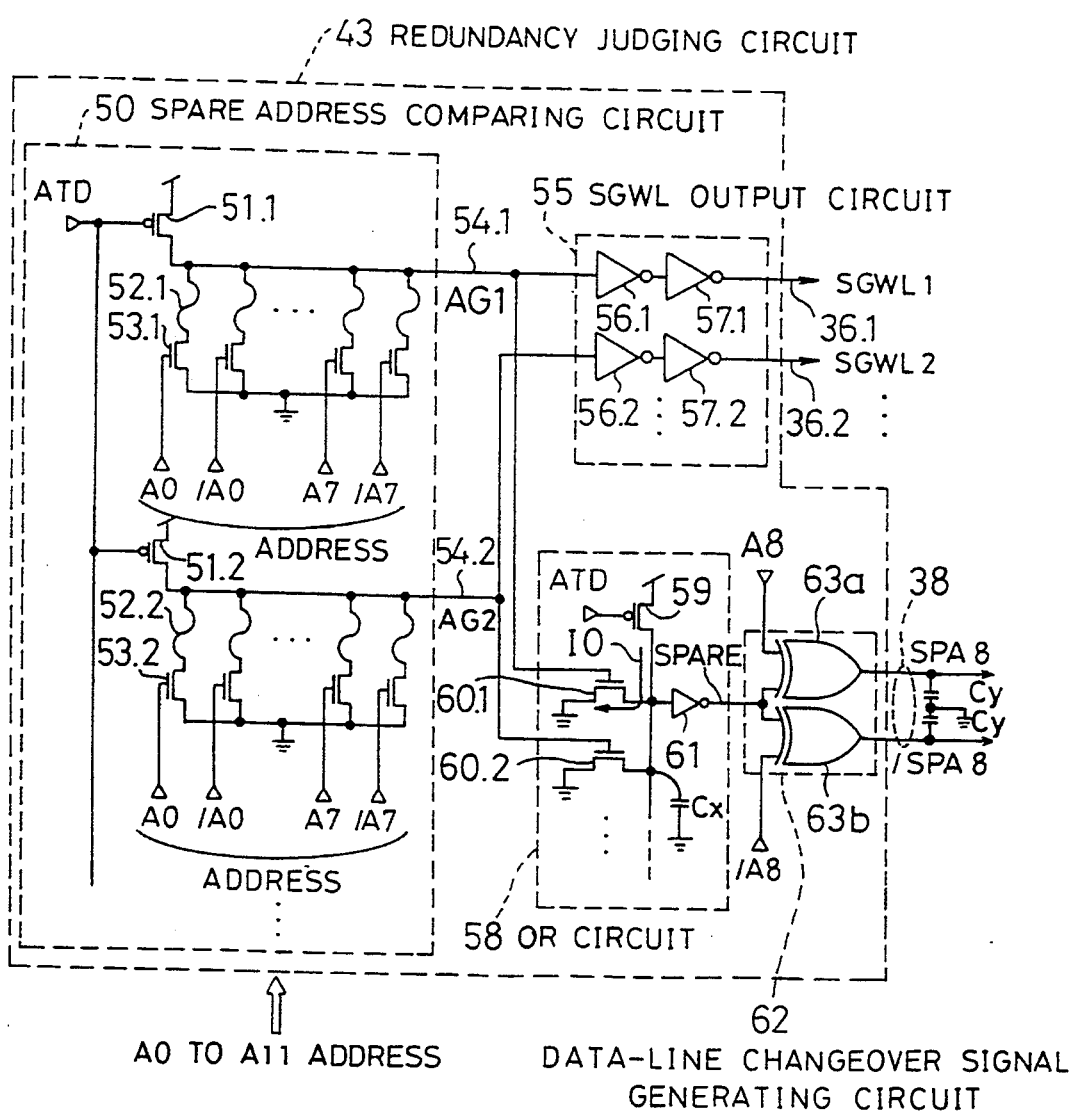
FIG. 2 is a circuit diagram illustrating the inside arrangement of the redundancy judging circuit unit in FIG. 1.

FIG. 2 is a circuit diagram illustrating the inside arrangement of the redundancy judging circuit unit 43. As shown in FIG. 2, the redundancy judging circuit unit 43 comprises a spare address comparing circuit 50, a spare global word line output circuit (SGWL output circuit) 55, an OR circuit 58 and a data-line changeover signal generating circuit 62.

The spare address comparing circuit 50 has (i) fuses 52.1, 52.2, . . . for programming maximum m-piece spare addresses, (ii) pull-up P-channel MOSFETs 51.1, 51.2, . . . , to the gates of which commonly supplied is an address transition detecting signal ATD which is changed to a low level pulse when the input address varies, and (iii) N-channel MOSFETs 53.1, 53.2, . . . of which one ends are grounded. The spare address comparing circuit 50 is adapted to compare a plurality of spare addresses programmed by the fuses 52.1, 52.2, . . . with the lower eight bits A0 to A7 of an input address having 12 bits of A0 to A11.

When the plurality of programmed spare addresses contain an address having the lower eight bits A0 to A7 identical with those of the input address, the voltage of a coincidence signal line concerned out of coincidence signal lines 54.1, 54.2, . . . is raised to a high level. Coincidence signals AG1, AG2, . . . on the coincidence signal lines 54.1, 54.2, . . . are supplied to the SGWL output circuit 55 and the OR circuit 58. When there is no identical address, i.e., when the input address is a normal address, all the coincidence signal lines 54.1, 54.2, . . . are maintained at low levels.

In the SGWL output circuit 55, the coincidence signal lines 54.1, 54.2, . . . are connected to input terminals of first inverters 56.1, 56.2, . . . , of which output terminals are connected to input terminals of second inverters 57.1, 57.2, . . . . The spare global word lines 36.1, 36.2, . . . are connected to output terminals of the second inverters 57.1, 57.2, . . . . Accordingly, only when a spare address is entered, one of the m-piece spare global word lines 36.1, 36.2, . . . is raised to a high level.

The OR circuit 58 has (i) a pull-up P-channel MOSFET 59, to the gate of which the address transition detecting signal ATD is supplied, (ii) m-piece N-channel MOSFETs 60.1, 60.2, . . . , to the gates of which the AG1, AG2, . . . are supplied, and (iii) an output inverter 61. For example, when the first coincidence signal AG1 becomes a high level, a feedthrough current IO flows from the power supply to the grounding line through the P-channel MOSFET 59 and the first N-channel MOSFET 60.1, and the voltage of the inverter 61 at the input point thereof becomes a low level. As a result, a high-level redundancy judging signal SPARE is supplied from the inverter 61. The foregoing is also applied when any other coincidence signal becomes a high level. More specifically, when one of the m-piece coincidence signals AG1, AG2, . . . from the spare address comparing circuit 50 is in a high level, the SPARE becomes a high level, and information that the input address having 12 bits of A0 to A11 is a spare address, is transmitted to the data-line changeover signal generating circuit 62.

The data-line changeover signal generating circuit 62 has first and second EXOR circuits 63a, 63b. Supplied to a first input terminal of the first EXOR circuit 63a is the least significant bit A8 of the upper four bits A8 to A11 for block selection, out of the 12 bits of A0 to A11 of the input address. The SPARE is supplied to a second input terminal from the OR circuit 58. On the other hand, an inversional signal /A8 of A8 is supplied to a first input terminal of the second EXOR circuit 63b, and the SPARE is supplied to a second input terminal thereof. The output SPA8 of the first EXOR circuit 63a and the output /SPA8 of the second EXOR circuit 63b are transmitted, as complementary signals on the data-line changeover signal line 38, to the selecting amplifier 47, of which inside arrangement will be discussed in the following.

Figure 3:
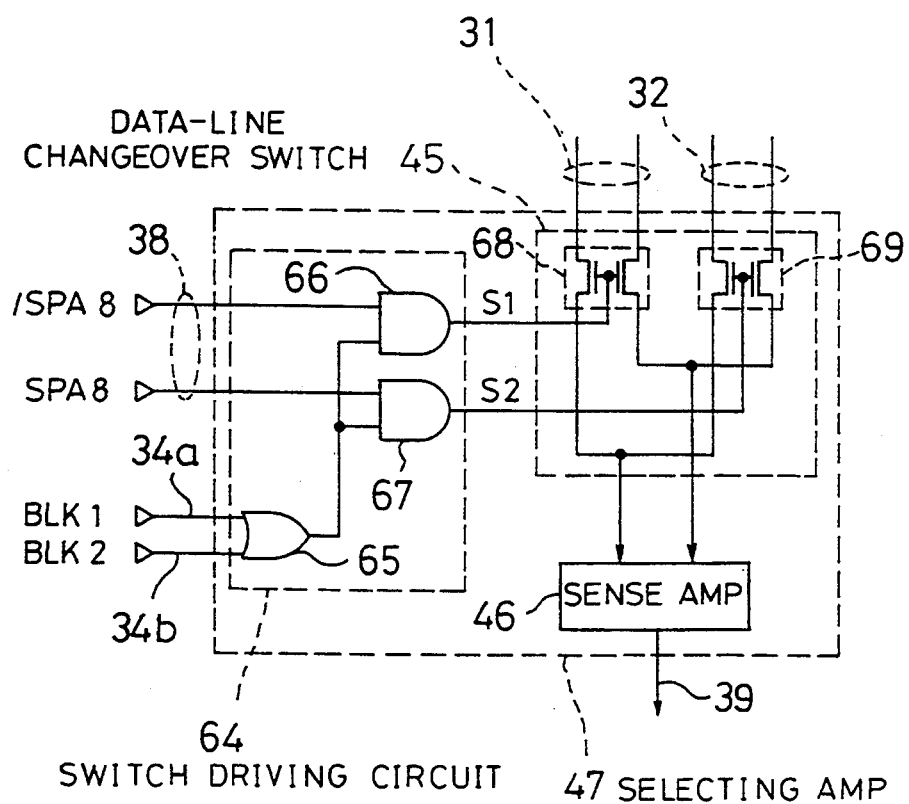
FIG. 3 is a circuit diagram illustrating the inside arrangement of the selecting amplifier in FIG. 1.

FIG. 3 is a circuit diagram illustrating the inside arrangement of the selecting amplifier 47. As shown in FIG. 3, the selecting amplifier 47 comprises (i) the data-line changeover switch 45 having two N-channel transfer gates 68, 69 for selectively supplying either one of information on the first pair of data lines 31 and information on the second pair of data lines 32, (ii) a switch driving circuit 64 for switching the selecting operation of the data-line changeover switch 45 according to the SPA8, /SPA8 supplied from the redundancy judging circuit unit 43, and (iii) the sense amplifier 46 for amplifying and supplying an output of the data-line changeover switch 45 to the output data line 39.

The switch driving circuit 64 has an OR circuit 65 for operating the logical sum of the BLK1 and the BLK2, and first and second AND circuits 66, 67. The first AND circuit 66 is adapted to supply, as a first selecting signal S1, a signal of logical product of the /SPA8 and an output of the OR circuit 65 such that the N-channel transfer gate 68 at the side of the first pair of data lines 31 is conducted. The second AND circuit 67 is adapted to supply, as a second selecting signal S2, a signal of logical product of the SPA8 and an output of the OR circuit 65 such that the N-channel transfer gate 69 at the side of the second pair of data lines 32 is conducted.

Figure 4:
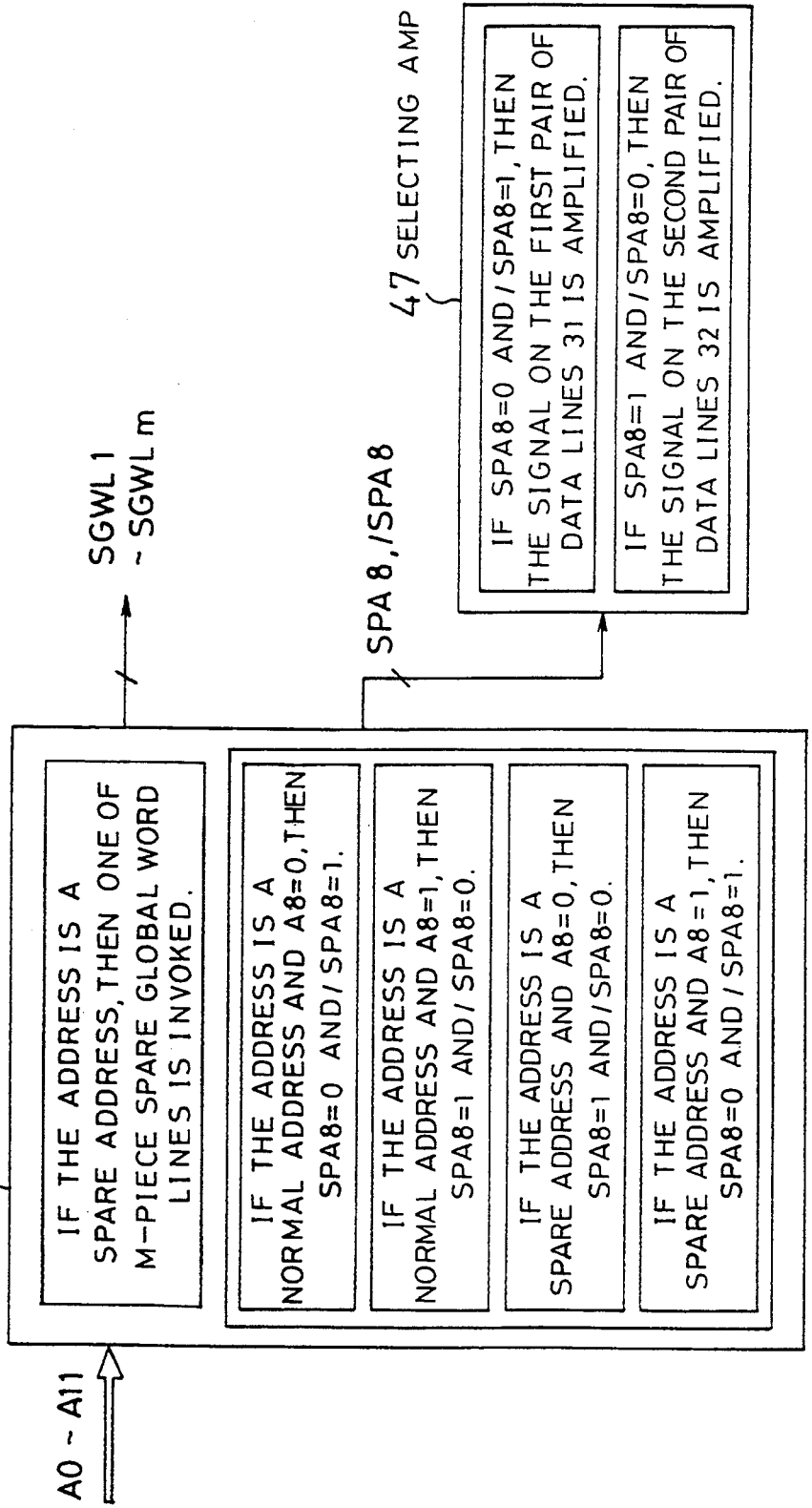
FIG. 4 is a conceptual view illustrating the functions of the redundancy judging circuit unit in FIG. 2 and the selecting amplifier in FIG. 3.

FIG. 4 shows the functions of the redundancy judging circuit unit 43 and the selecting amplifier 47 which have been discussed in the foregoing.

The redundancy judging circuit unit 43 has a function of raising, to a high level, one of the m-piece spare global word lines 36.1, 36.2, . . . only at the time when a spare address is entered. Further, the redundancy judging circuit unit 43 has a function that the SPA8 is made equal to 0 (low level) and the /SPA8 is made equal to 1 (high level) by the operations of the two EXOR circuits 63a, 63b when the input address is a normal address (SPARE=0) and the A8 is equal to 0 (/A8 is equal to 1). The SPA8 is made equal to 1 and the /SPA8 is made equal to 0 when the input address is a normal address (SPARE=0) and the A8 is equal to 1 (/A8=0), the SPA8 is made equal to 1 and the /SPA8 is made equal to 0 when the input address is a spare address (SPARE=1) and the A8 is equal to 0 (/A8=1), and the SPA8 is made equal to 0 and the /SPA8 is made equal to 1 when the input address is a spare address (SPARE=1) and the A8 is equal to 1 (/A8=0). On the other hand, the selecting amplifier 47 has a function of amplifying information on the first pair of data lines 31 when the SPA8 is equal to 0 and the /SPA8 is equal to 1, and of amplifying information on the second pair of data lines 32 when the SPA8 is equal to 1 and the /SPA8 is equal to 0.

Figure 5:
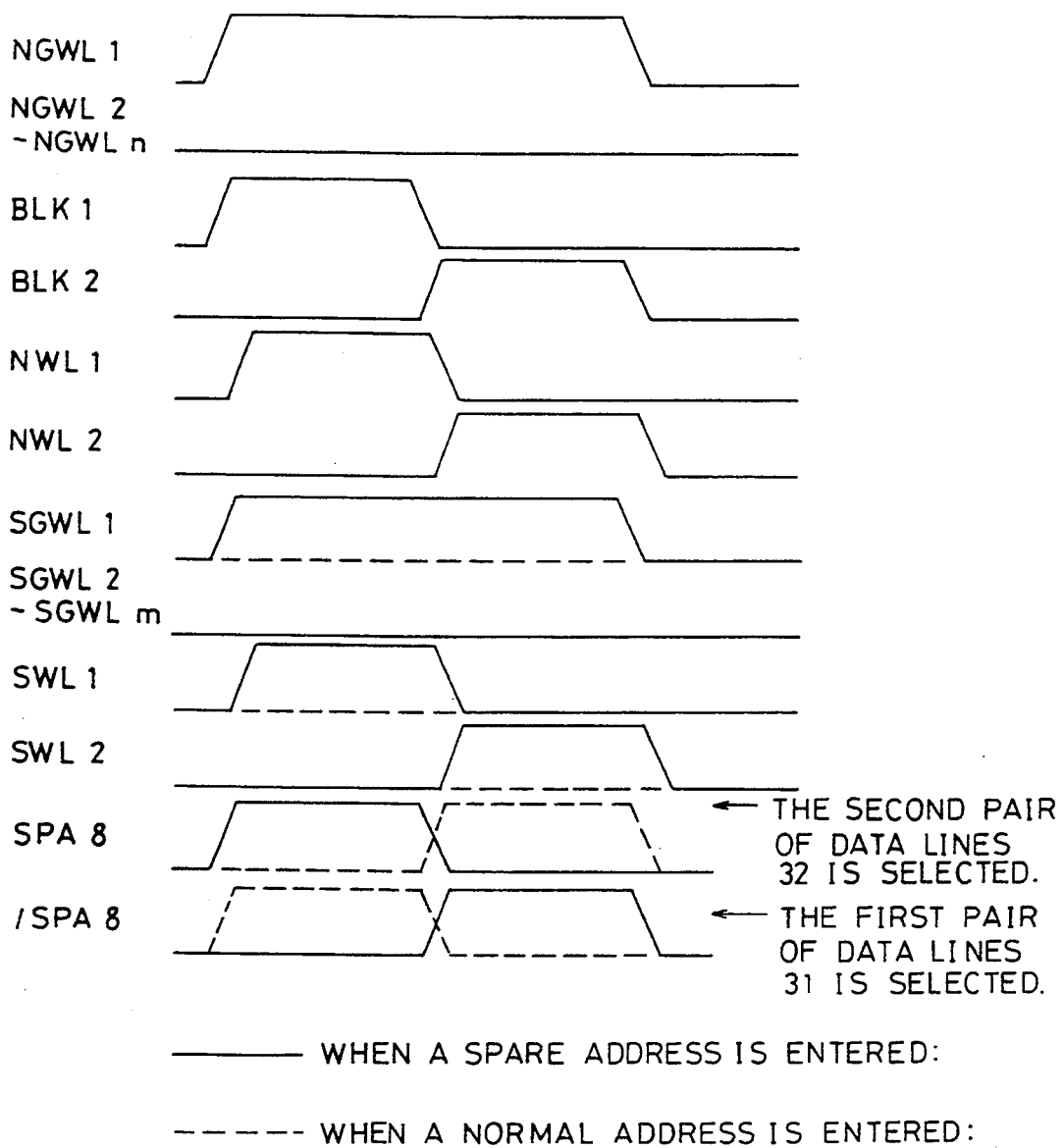
FIG. 5 is a diagram of operational waveforms of the SRAM reading circuit portion in FIG. 1.

According to the arrangement above-mentioned, information of one of the first and second normal cells 11.$h$, 12.$h$ ($h$=1 to n) is read out onto the output data line 39 when a normal address is entered, and information of one of the first and second spare cells 21.j, 22.j (j=1 to m) is read out onto the output data line 39 when a spare address is entered. This is illustrated in FIG. 5, which shows an example where the second normal cell 12.1 selected by the NWL2 is accessed subsequently to the access to the first normal cell 11.1 selected by the NWL1.

First, the following description will discuss a case where a normal address is entered. The NGWL1 and the BLK1 are raised by the decoder 41. This causes the NWL1 to be raised to a high level through the AND circuit 42.1 to select the first normal cell 11.1. On the other hand, since the redundancy judging circuit unit 43 maintains all the SGWL1, SGWL2, . . . to low levels, all the SWL1, SWL2, . . . are in low levels. Further, since the redundancy judging circuit unit 43 causes the SPA8 and the /SPA8 to be made equal to 0 and 1, respectively, the selecting amplifier 47 is switched to the side of the first pair of data lines 31. As a result, information read out from the first normal cell 11.1 onto the first pair of data lines 31, is amplified and supplied to the output data line 39. By the decoder 41, the BLK2 is raised instead of the BLK1. This causes the NWL2 to be raised to a high level through the AND circuit 42.2 to select the second normal cell 12.1. On the other hand, since the redundancy judging circuit unit 43 maintains all the SGWL1, SGWL2, . . . to low levels, all the SWL1, SWL2, . . . are in low levels. Further, since the redundancy judging circuit unit 43 causes the SPA8 and the /SPA8 to be made equal to 1 and 0, respectively, the selecting amplifier 47 is switched to the side of the second pair of data lines 32. As a result, information read out from the second normal cell 12.1 onto the second pair of data lines 32, is amplified and supplied to the output data line 39.

The following description will discuss a case where a spare address is entered. The NGWL1 and the BLK1 are raised by the decoder 41. This causes the NWL1 to be raised to select the first normal cell 11.1. Simultaneously, the redundancy judging circuit unit 43 detects that the input address is a spare address, and causes the SGWL1 to be raised. This causes the SWL1 to be raised to a high level through the AND circuit 44.1 to select the second spare cell 22.1. Further, since the redundancy judging circuit unit 43 causes the SPA8 and the /SPA8 to be made equal to 1 and 0, respectively, the selecting amplifier 47 is switched to the side of the second pair of data lines 32. As a result, information read out onto the second pair of data lines 32 from the second spare cell 22.1 instead of the first normal cell 11.1 which is defective, is amplified and supplied to the output data line 39. If the second normal cell 12.1 is defective, information read out onto the first pair of data lines 31 from the first spare cell 21.1, is supplied to the output data line 39.

As discussed in the foregoing, according to this embodiment, while the decoder 41 decodes the input address A0 to A11 in order to select one of the 2 n-piece normal cells 11.h, 12.h (h=1 to n), the redundancy judging circuit unit 43 simultaneously judges whether the input address is a spare address or a normal address, and determines which spare cell is to be used as a substitute cell. This enables a spare cell to be read out at a high speed equivalent to a speed at which a normal cell is read. Further, disposed in the second cell array adjacent to the first cell array are the m-piece second spare cells 22.1, 22.2, . . . as substitute cells of the n-piece first normal cells 11.1, 11.2, . . . in the first cell array. Also disposed in the first cell array adjacent to the second cell array are the m-piece first spare cells 21.1, 21.2, . . . as substitute cells of the n-piece second normal cells 12.1, 12.2, . . . in the second cell array. This assures a high defect-relief rate, yet reducing the number of the block selecting lines disposed in each cell array to at most two (34a, 34b). Unlike in a conventional arrangement, the chip area can be reduced without a great number of block selecting lines required to be disposed in each cell array in order to enhance the defect relief rate.

Further, the redundancy judging circuit unit 43 is arranged to supply one of the SGWL1, SGWL2, . . . only at the time when a spare address is entered. This reduces the current consumption at the time when a normal address is entered. Unlike in a conventional arrangement in which one sense amplifier is disposed for each cell array, one selecting amplifier 47 is disposed per two cell arrays. This reduces the number of the required sense amplifiers 46, so that the chip area can be further reduced.

In this embodiment, an input address has 12 bits, of which four bits are used for block selection. However, it is a matter of course that the present invention is not limited to such an arrangement.

To relieve a great number of defective cells for enhancing the yield with a tendency to increase a semiconductor memory in capacity, it is required to increase the number of inputs of the coincidence signals AG1, AG2, . . . in the OR circuit 58 shown in FIG. 2. In this connection, when the number of the N-channel MOSFETs 60.1, 60.2, . . . is increased, this disadvantageously increases the parasitism capacitance Cx adjunct to the input point of the inverter 61. Further, when the chip area is increased with the tendency to increase a semiconductor memory in capacity, the wiring length of the data-line changeover signal line 38 between the redundancy judging circuit unit 43 and the selecting amplifier 47, is increased. This results in an increase in wiring capacitance Cy (See FIG. 2), thus provoking a problem of signal delay. Second and third embodiments of the present invention to be discussed in the following, include means of solving the problem above-mentioned.

Second Embodiment

An SRAM serving as a semiconductor integrated circuit according to a second embodiment of the present invention, is adapted such that the transmission of the data-line changeover signals SPA8, /SPA8 from the redundancy judging circuit unit 43 to the selecting amplifier 47 in the first embodiment, is achieved based on a difference in electric current. The second embodiment employs a circuit arrangement shown in FIG. 6 as a modification of the data-line changeover signal generating circuit 62 in FIG. 2, and a circuit arrangement shown in FIG. 7 as a modification of the switch driving circuit 64 in FIG. 3. Other portions of the second embodiment are similar to the first embodiment and will not be discussed in the following.

Figure 6:
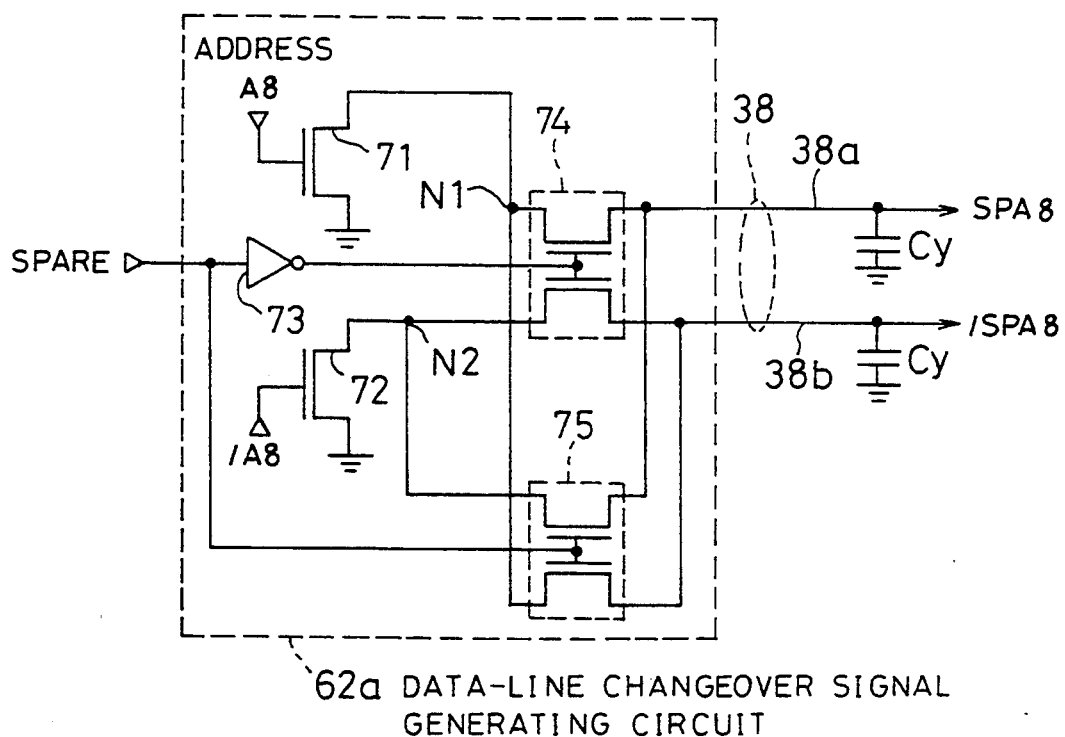
FIG. 6 is a circuit diagram illustrating the inside arrangement of a data-line changeover signal generating circuit in a redundancy judging circuit unit of an SRAM serving as a semiconductor integrated circuit according to a second embodiment of the present invention.

As shown in FIG. 6, a data-line changeover signal generating circuit 62a in the second embodiment has first and second N-channel MOSFETs 71, 72, an inverter 73 and first and second N-channel transfer gates 74, 75. The first and second N-channel MOSFETs 71, 72 have (i) gates to which A8, /A8 are respectively given, (ii) sources respectively connected to nodes N1, N2, and (iii) drains which are grounded. The redundancy judging signal SPARE supplied from the OR circuit 58, is supplied to the gate terminal of the first N-channel transfer gate 74 through the inverter 73, and also supplied directly to the gate terminal of the second N-channel transfer gate 75. In the first N-channel transfer gate 74, the nodes N1 and N2 are respectively connected to a first signal transmitting line 38a and a second signal transmitting line 38b of the data-line changeover signal line 38. On the contrary, the second N-channel transfer gate 75 is arranged such that the nodes N2 and N1 are respectively connected to the first signal transmitting line 38a and the second signal transmitting line 38b of the data-line changeover signal line 38.

Figure 7:
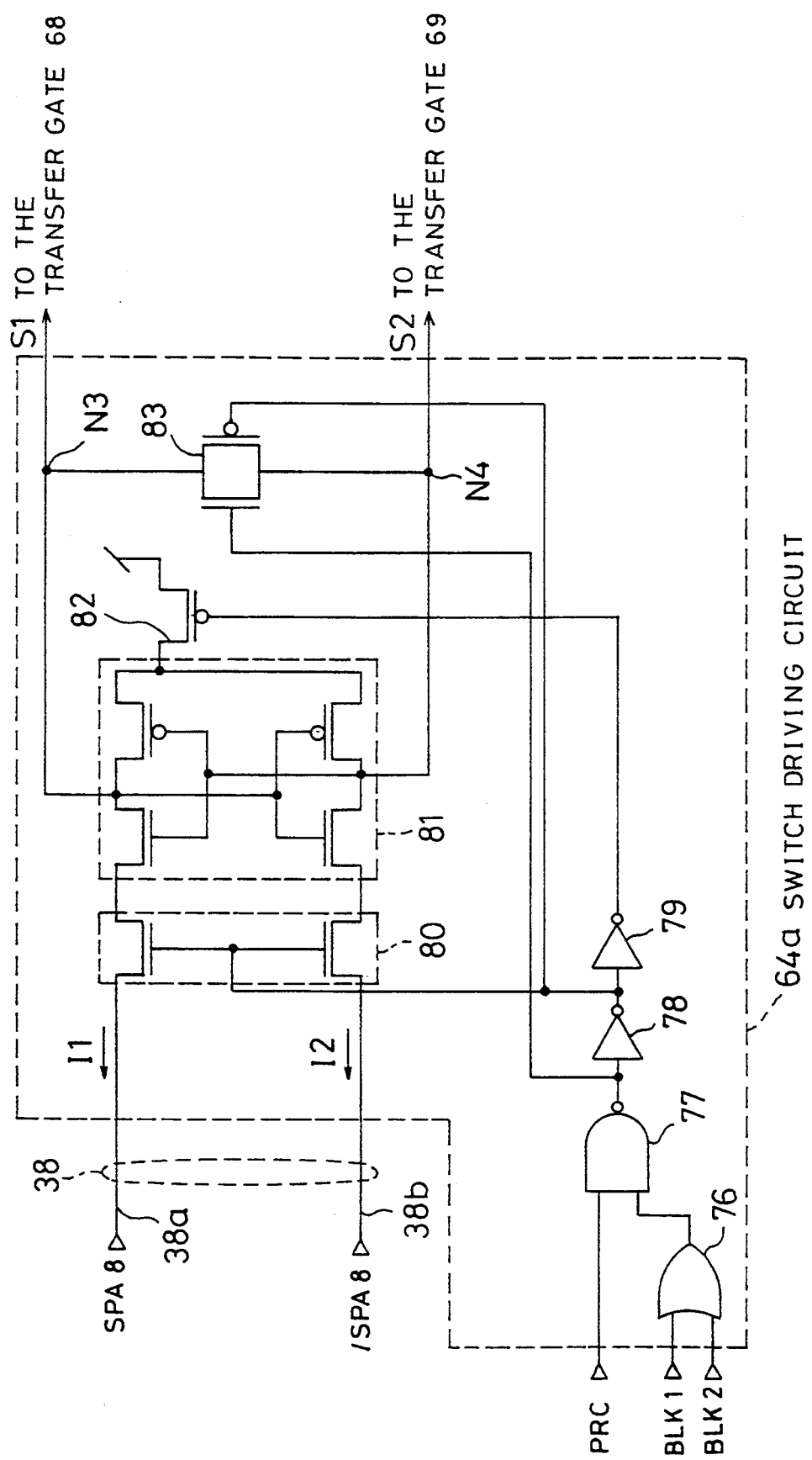
FIG. 7 is a circuit diagram illustrating the inside arrangement of the switch driving circuit in the selecting amplifier of the SRAM serving as a semiconductor integrated circuit according to the second embodiment of the present invention.

As shown in FIG. 7, a switch driving circuit 64a in the second embodiment comprises: an OR circuit 76; a NAND circuit 77; two inverters 78, 79; an N-channel transfer gate 80 connected to the data-line changeover signal line 38; a current-detection-type amplifier 81 having two sets of P-channel MOSFETs and N-channel MOSFETs; a pull-up P-channel MOSFET 82; and an equalizer 83 for short-circuiting output nodes N3 and N4 of the current-detection-type amplifier 81. The OR circuit 76 is adapted to supply, to the NAND circuit 77, a signal of logical sum of first and second block selecting signals BLK1, BLK2. The NAND circuit 77 is adapted to operate a logical product of an output of the OR circuit 76 and an amplifier activating signal PRC generated at the time when the input address varies, likewise the address transition detecting signal ATD. While theoutput of the NAND circuit 77 is in a high level, the N-channel transfer gate 80 and the P-channel MOSFET 82 are turned off and the equalizer 83 is conducted to maintain the N3 and the N4 at the same potential. When the output of the NAND circuit 77 becomes a low level, the equalizer 83 is turned off and both the N-channel transfer gate 80 and the P-channel MOSFET 82 are conducted. As a result, a power supply voltage Vcc is applied to the current-detection-type amplifier 81, and two input terminals of the current-detection-type amplifier 81 are respectively connected to the first and second signal transmitting lines 38a, 38b through the N-channel transfer gate 80.

In the data-line changeover signal generating circuit 62a (FIG. 6), if for example A8 is equal to 0 (/A8 is equal to 1) at the time when a normal address is entered (SPARE=0), the second N-channel MOSFET 72 and the first N-channel transfer gate 74 are conducted. This causes the first signal transmitting line 38a to become in a floating state (in a high-impedance state), and the second signal transmitting line 38b to be grounded through the second N-channel MOSFET 72. That is, a difference in impedance is generated between the signal transmitting lines 38a, 38b. Based on such impedance difference, there is supplied a small current I2 (I1=0) only to the second signal transmitting line 38b from the current-detection-type amplifier 81 in the switch driving circuit 64a (FIG. 7) in which the N-channel transfer gate 80 and the P-channel MOSFET 82 are conducted. It means that data-line changeover signals SPA8=0 (the first signal transmitting line 38a) and /SPA8=1 (the second signal transmitting line 38b) are transmitted based on a current difference (I2 is greater than I1). As a result, the potential of one output node N3 of the current-detection-type amplifier 81 is increased and immediately becomes a high level, and the potential of the other output node N4 is dropped and immediately becomes a low level. More specifically, according to the difference in impedance between the first and second signal transmitting lines 38a, 38b, the current-detection-type amplifier 81 generates, between both signal transmitting lines 38a, 38b, a difference in current, which is then detected and converted into a difference in potential. When the potential of the node N3, i.e., the first selecting signal S1, becomes a high level in the manner above-mentioned, the N-channel transfer gate 68 at the side of the first pair of data lines 31 in FIG. 3 is conducted. Accordingly, information read out from, for example, the first normal cell 11.1 onto the first pair of data lines 31, is supplied to the output data line 39, likewise in the first embodiment.

When a normal address in which A8 is equal to 1 (/A8 is equal to 0) is entered, the first N-channel MOSFET 71 and the second N-channel transfer gate 75 are conducted in the data-line changeover signal generating circuit 62a (FIG. 6). Accordingly, the first signal transmitting line 38a is grounded through the first N-channel MOSFET 71, and the second signal transmitting line 38b becomes in a floating state (a high impedance state). Based on such impedance difference, a small current I1 (I2=0) is supplied, this time, only to the first signal transmitting line 38a from the current-detection-type amplifier 81 in the switch driving circuit 64a (FIG. 7). It means that data-line changeover signals SPA8=1 (the first signal transmitting line 38a) and /SPA8=0 (the second signal transmitting line 38b) are transmitted based on a current difference (I1 is greater than I2). As a result, the potential of the node N3 of the current-detection-type amplifier 81 becomes a low level, and the potential of the node N4 becomes a high level. When the potential of the node N4, i.e., the second selecting signal S2, becomes a high level in the manner above-mentioned, the N-channel transfer gate 69 at the side of the second pair of data lines 32 in FIG. 3 is conducted. Accordingly, information read out from, for example, the second normal cell 12.1 onto the second pair of data lines 32, is supplied to the output data line 39, likewise in the first embodiment.

When a spare address is entered, the selection of the first and second N-channel transfer gates 74, 75 in the data-line changeover signal generating circuit 62a (FIG. 6) is reverse to that to be made when a normal address is entered. Accordingly, the selecting operation of the selecting amplifier 47 is also inverted.

As discussed in the foregoing, according to the second embodiment, the data-line changeover signals SPA8, /SPA8 are transmitted, based on a difference in current, from the redundancy judging circuit unit 43 to the selecting amplifier 47. Accordingly, even though the wiring length of the data-line changeover signal line 38 is lengthened to increase the wiring capacitance Cy, a signal delay is relaxed as compared with the case where the transmission of the signals above-mentioned is achieved based on a difference in voltage. Further, the current I1 or I2 supplied from the current-detection-type amplifier 81 to the data-line changeover signal line 38 disappears in a short period of time, enabling the current consumption to be lowered.

In the second embodiment, two N-channel MOSFETs 71, 72 are used for generating a difference in output impedance between the two signal transmitting lines 38a, 38b in the data-line changeover signal generating circuit 62a (FIG. 6). However, there may be used any elements as far as their resistance values up to the grounding line vary by a control signal. Further, there is used, in the switch driving circuit 64a (FIG. 7), the current-detection-type amplifier 81 of the cross couple type formed by two pairs of P-channel MOSFETs and N-channel MOSFETs. However, any other arrangement may be used as far as a current difference can be detected and converted into a potential difference.

Third Embodiment

Figure 8:
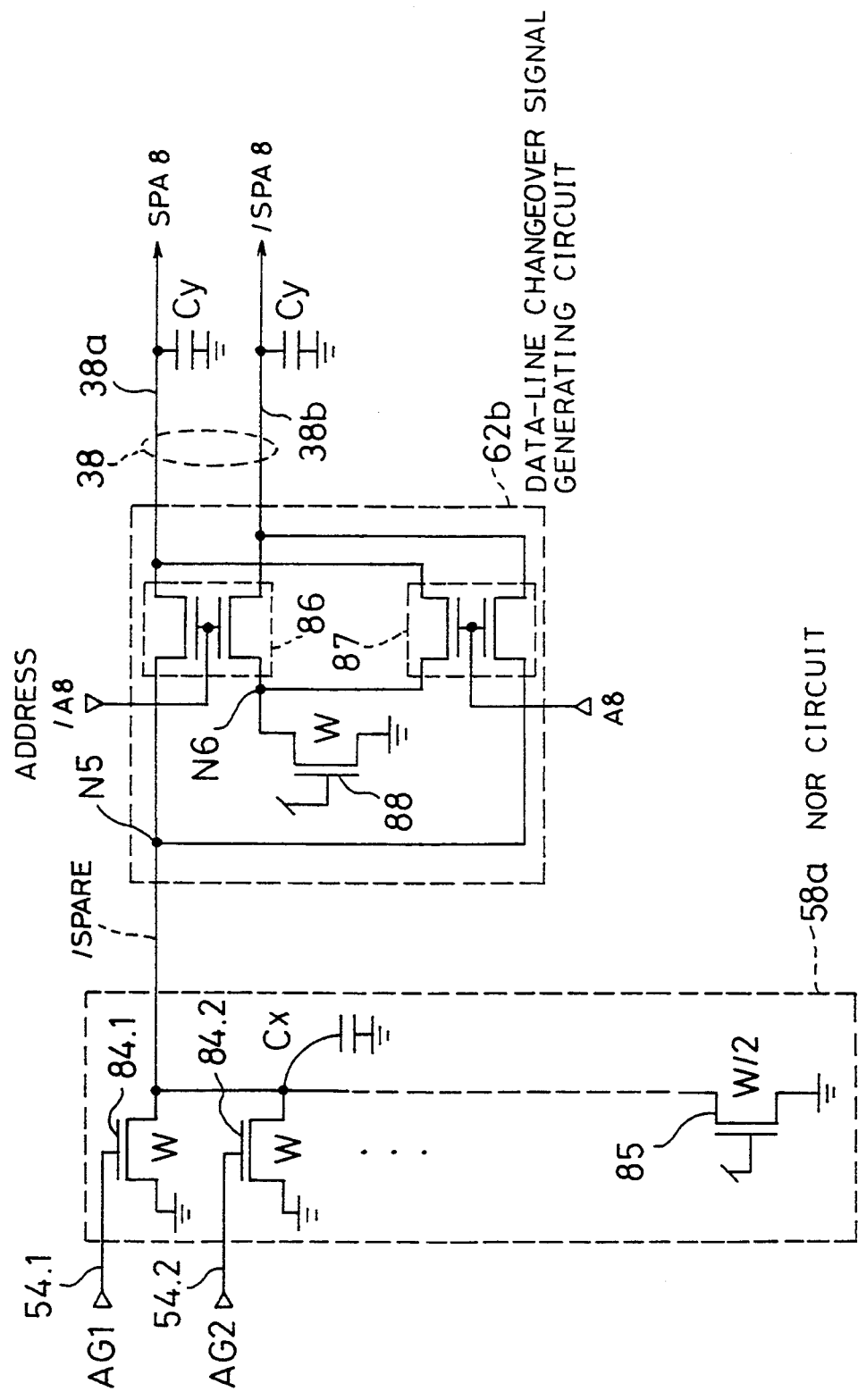
FIG. 8 is a circuit diagram illustrating the inside arrangements of a logical sum circuit and a data-line changeover signal generating circuit in a redundancy judging circuit unit of an SRAM serving as a semiconductor integrated circuit according to a third embodiment of the present invention.

An SRAM serving as a semiconductor integrated circuit according to a third embodiment of the present invention, employs a circuit arrangement shown in FIG. 8 as a modification of the circuit arrangement including the OR circuit 58 and the data-line changeover signal generating circuit 62 in FIG. 2. The third embodiment is the same as the second embodiment in that the circuit arrangement shown in FIG. 7 is used as a modification of the switch driving circuit 64 in FIG. 3. In the third embodiment, other portions are similar to the first embodiment.

As shown in FIG. 8, an NOR circuit 58a is used in the third embodiment instead of the OR circuit 58 in the redundancy judging circuit unit 43 (FIG. 2), and has (i) m-piece N-channel MOSFETs 84.1, 84.2, . . . to the gates of which AG1, AG2, . . . are given from the spare address comparing circuit 50 through the coincidence signal lines 54.1, 54.2, . . . , and (ii) an N-channel MOSFET 85 for impedance adjustment. Each of the m-piece N-channel MOSFETs 84.1, 84.2, . . . serving as input MOSFETs, has a gate width W, while the impedance adjusting N-channel MOSFET 85 has a gate width W/2. Further, a power supply voltage Vcc is always applied to the gate of the impedance adjusting N-channel MOSFET 85. These (m+1)-piece N-channel MOSFETs 84.1, 84.2, . . . , and 85 are commonly connected to one node N5. That is, the node N5 is always grounded through the impedance adjusting N-channel MOSFET 85 having the gate width W/2.

A data-line changeover signal generating circuit 62b for receiving a redundancy judging signal /SPARE from the NOR circuit 58a, has first and second N-channel transfer gates 86, 87, and an impedance adjusting N-channel MOSFET 88. The impedance adjusting N-channel MOSFET 88 has a gate width W which is equal to that of each of the m-piece N-channel MOSFETs 84.1, 84.2, . . . in the NOR circuit 58a. Further, the power supply voltage Vcc is always applied to the gate of the impedance adjusting N-channel MOSFET 88. On the other hand, /A8 and A8 are given to the gate terminals of the first and second N-channel transfer gates 86, 87, respectively. In the first N-channel transfer gate 86, the node N5 is connected to the first signal transmitting line 38a of the data-line changeover signal line 38, and a node N6 to which the impedance adjusting N-channel MOSFET 88 is connected, is connected to the second signal transmitting line 38b. In the second N-channel transfer gate 87, the node N6 is connected to the first signal transmitting line 38a, and the node N5 is connected to the second signal transmitting line 38b. The node N6 is always grounded through the impedance adjusting N-channel MOSFET 88 having the gate width W.

First, the following description will discuss the operation at the time when a normal address is entered. When a normal address is entered, all the AG1, AG2, . . . are in low levels. Accordingly, the m-piece N-channel MOSFETs 84.1, 84.2, . . . serving as input MOSFETs in the NOR circuit 58a, are turned off. Accordingly, the node N5 is grounded only through the impedance adjusting N-channel MOSFET 85 having the gate width W/2 in the NOR circuit 58a. For example, when A8 is equal to 0 (/A8 is equal to 1) in the state above-mentioned, the first N-channel transfer gate 86 is conducted. This causes the first signal transmitting line 38a to be grounded through the MOSFET 85 having the gate width W/2, and the second signal transmitting line 38b to be grounded through the MOSFET 88 having the gate width W, thus generating a difference in impedance between both signal transmitting lines 38a, 38b. Based on the impedance difference, there is generated a current difference (I2 is greater than I1) between the first and second signal transmitting lines 38a, 38b by the operation of the current-detection-type amplifier 81 in the switch driving circuit 64a (FIG. 7) likewise in the second embodiment. It means that, based on the current difference, data-line changeover signals SPA8=0 (the first signal transmitting line 38a) and /SPA8=1 (the second signal transmitting line 38b) are transmitted. As a result, the N-channel transfer gate 68 at the side of the first pair of data lines 31 in FIG. 3 is conducted. Accordingly, information read out from, for example, the first normal cell 11.1 onto the first pair of data lines 31, is supplied to the output data line 39. When a normal address having A8 equal to 1 (/A8=0) is entered, the second N-channel transfer gate 87 is conducted instead of the first N-channel transfer gate 86. Accordingly, the selecting operation of the selecting amplifier 47 is inverted.

The following description will discuss the operation at the time when a spare address is entered. When a spare address is entered, one of the AG1, AG2, . . . becomes a high level. Accordingly, one of the m-piece N-channel MOSFETs 84.1, 84.2, . . . as input MOSFETs in the NOR circuit 58a is conducted. For example, when it is now supposed that the first N-channel MOSFET 84.1 is conducted in response to the AG1, the node N5 is grounded through the first N-channel MOSFET 84.1 and the impedance adjusting N-channel MOSFET 85 which are connected in parallel with each other. In the state above-mentioned, when for example A8 is equal to 0 (/A8 is equal to 1), the first N-channel transfer gate 86 is conducted. Accordingly, the first signal transmitting line 38a is grounded through the MOSFET 84.1 having the gate width W and the MOSFET 85 having the gate width W/2 which are connected in parallel with each other, and the second signal transmitting line 38b is grounded through the MOSFET 88 having the gate width W. This produces a difference in impedance between both signal transmitting lines 38a, 38b. The size relation between the impedances is reverse to that obtained at the time when a normal address is entered. Accordingly, generated between the first and second signal transmitting lines 38a, 38b is a current difference (I1 is greater than I2) which is reverse to the current difference generated at the time when a normal address is entered. Thus, information read out from, for example, the second spare cell 22.1 onto the second pair of data lines 32, is supplied to the output data line 39 by the selecting amplifier 47. Likewise, information read out from, for example, the first spare cell 21.1 onto the first pair of data lines 31, is supplied to the output data line 39 by the selecting amplifier 47 when a spare address having A8 equal to 1 (/A8=0) is entered.

Figure 9:
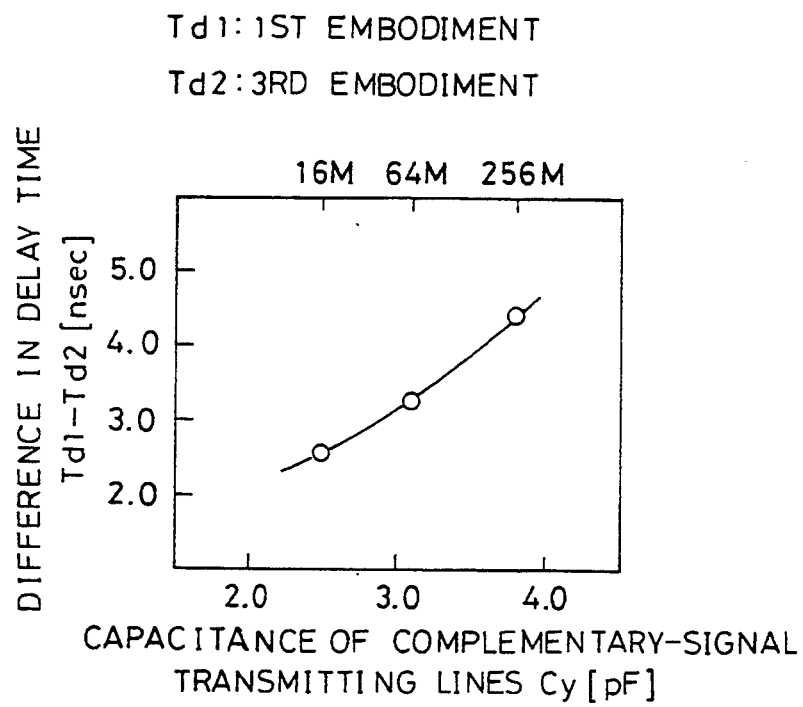
FIG. 9 is a view illustrating the effect of improvement in delay of a data-line changeover signal in the third embodiment of the present invention, such effect being shown in terms of the relation with wiring capacitance Cy.
Figure 10:
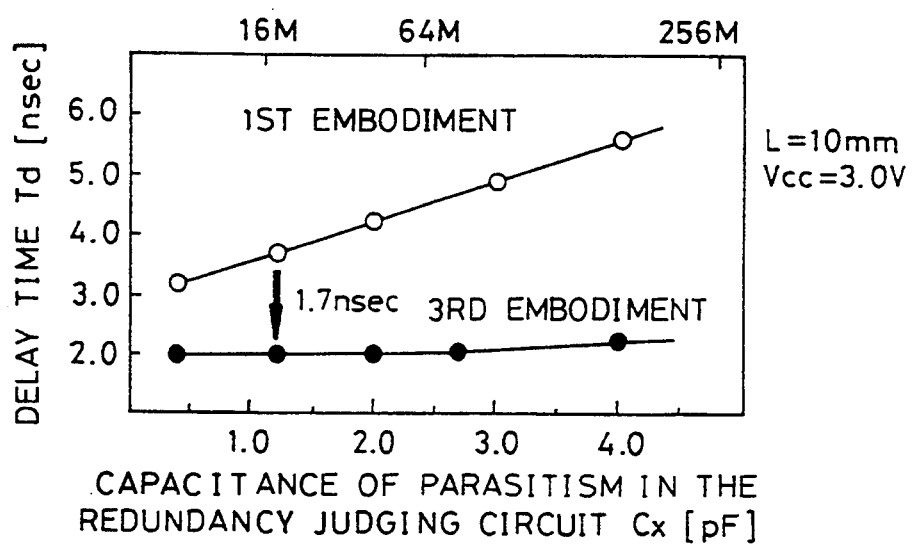
FIG. 10 is a view illustrating the effect of improvement in delay of a data-line changeover signal in the third embodiment of the present invention, such effect being shown in terms of the relation with parasitism capacitance Cx in the redundancy judging circuit unit.
Figure 11:
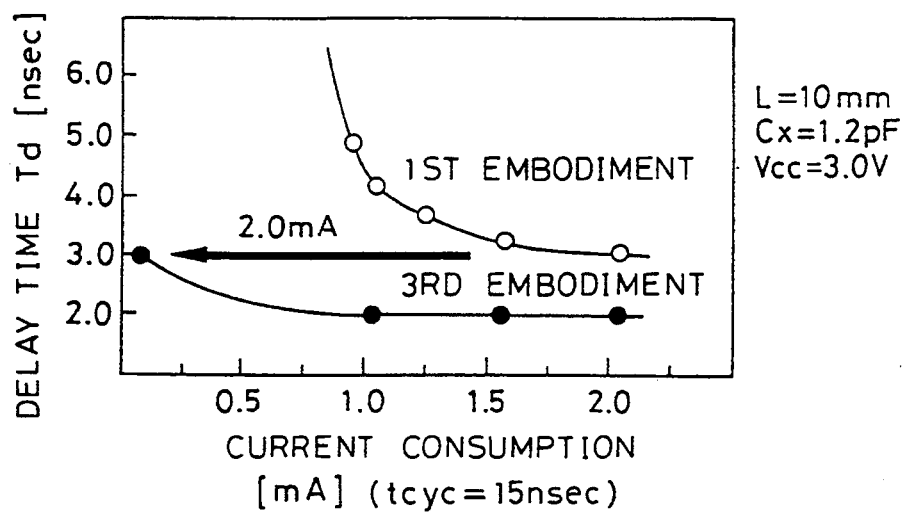
FIG. 11 is a view illustrating the effect of improvement in current consumption in the third embodiment of the present invention, such effect being shown in terms of the relation with delay time of a data-line changeover signal.
Figure 12:
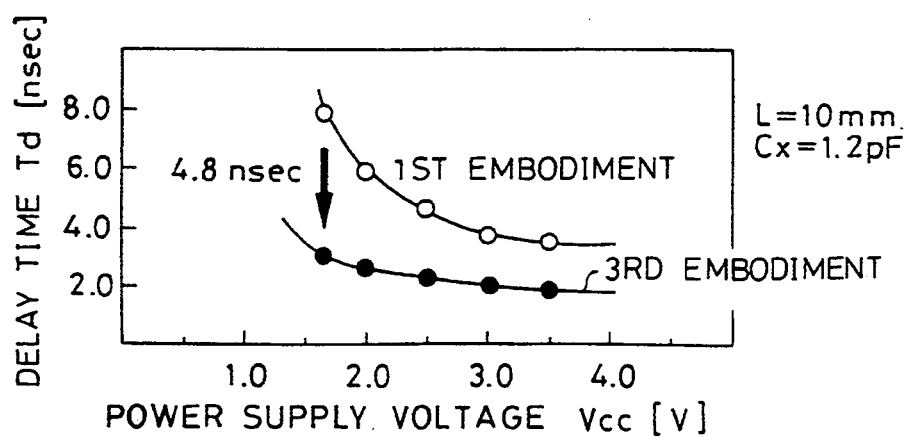
FIG. 12 is a view illustrating the effect of improvement in delay time of a data-line changeover signal with respect to power supply voltage dependency in the third embodiment of the present invention.

As discussed in the foregoing, according to the third embodiment, even though, with a tendency to increase a semiconductor memory in capacity, the wiring length L of the data-line changeover signal line (complementary-signal transmitting line) 38 is lengthened to increase the wiring capacitance Cy, a signal delay time Td is shortened likewise in the second embodiment. The delay time Td is defined as a period of time between the point of time when the output of the spare address comparing circuit 50 varies and the point of time when the signal reaches the data-line changeover switch 45. In the OR circuit 58 in FIG. 2, a great feedthrough current IO flows from the power supply through any of the input MOSFETs when a spare address is entered. In this third embodiment, however, even though one of the m-piece N-channel MOSFETs 84.1, 84.2, . . . in the NOR circuit 58a in FIG. 8, is conducted, a great feedthrough current does not flow therein, thus reducing the current consumption. Further, the nodes N5, N6 are always maintained at voltages near to the grounding potential through the impedance adjusting N-channel MOSFETs 85, 88. Accordingly, there can be achieved a high-speed redundancy judgement which does not depend on the parasitism capacitance Cx adjunct to the node N5. When a plurality of input MOSFETs 84.1, 84.2, . . . are disposed in the NOR circuits 58a in order to enhance the defect relief rate, the parasitism capacitance Cx is increased. Accordingly, this embodiment is particularly effective. As compared with the first embodiment, the effects produced by this third embodiment are shown in FIGS. 9 to 11. From the measurement result shown in FIG. 12, it is understood that the third embodiment produces an excellent effect Go lower the power supply voltage Vcc when the SRAM is driven by batteries.

The third embodiment employs, as impedance adjusting elements, the two N-channel MOSFETs 85, 88 which have different gate widths and to the gates of which the power supply voltage Vcc is applied. However, a difference in at-conduction impedance may be generated based on a difference in gate length. Further, a difference in at-conduction impedance may be generated based on a difference in gate voltage. It is also possible to employ a mere resistance of which impedance value does not vary.

Fourth Embodiment

Figure 13:
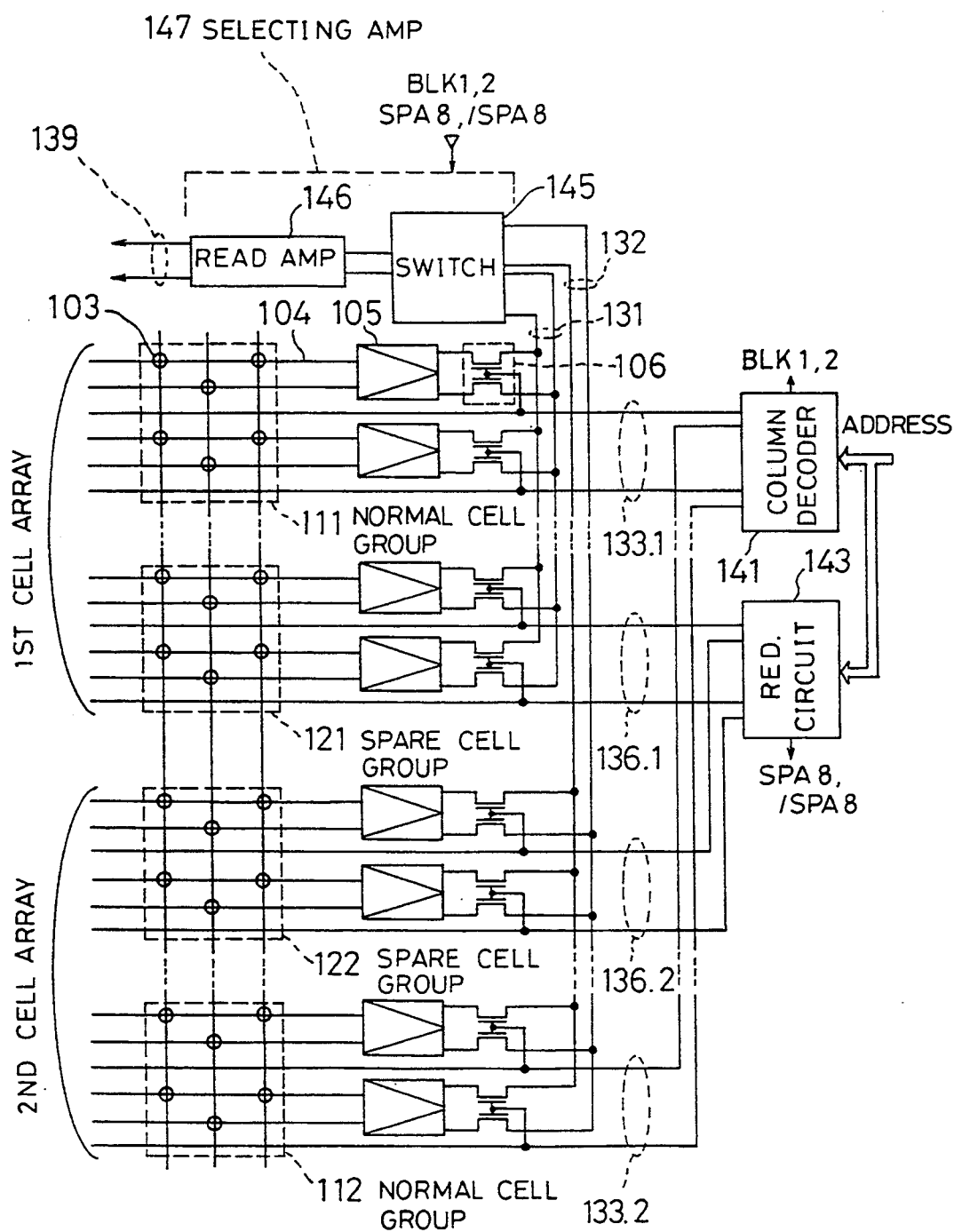
FIG. 13 is a circuit diagram illustrating the arrangement of a reading circuit portion of a DRAM serving as a semiconductor integrated circuit according to a fourth embodiment of the present invention.

The present invention may be applied to not only an SRAM, but also a DRAM. FIG. 13 is a circuit diagram illustrating the arrangement of a reading circuit portion of a DRAM serving as a semiconductor integrated circuit according to a fourth embodiment of the present invention. In FIG. 13, memory cells 103 are divided into a plurality of blocks including (i) a first cell array formed by a first normal cell group 111 and a first spare cell group 121, and (ii) a second cell array formed by a second normal cell group 112 and a second spare cell group 122. Normal column selecting lines 133.1, 133.2, . . . are to be selected by a column decoder 141, and spare column selecting lines 136.1, 136.2, . . . are to be selected by a redundancy judging circuit unit 143. Output information of a sense amplifier 105 connected to a bit line 104 of each memory cell 103, is read out onto a first or second pair of data lines 131, 132 through a column switch 106. Pieces of information on both pairs of data lines 131, 132, are read out onto a pair of output data lines 139 through a selecting amplifier 147 having a data-line changeover switch 145 and a read amplifier 146.

In the fourth embodiment, the normal column selecting lines 133.1, 133.2, . . . and the spare column selecting lines 136.1, 136.2, . . . respectively correspond to the normal global word lines 33.1, 33.2, . . . and the spare global word lines 36.1, 36.2, . . . in FIG. 1. Since the operation of the DRAM is basically the same as that of the SRAM mentioned earlier, the description thereof is here omitted.

Fifth Embodiment

Figure 14:
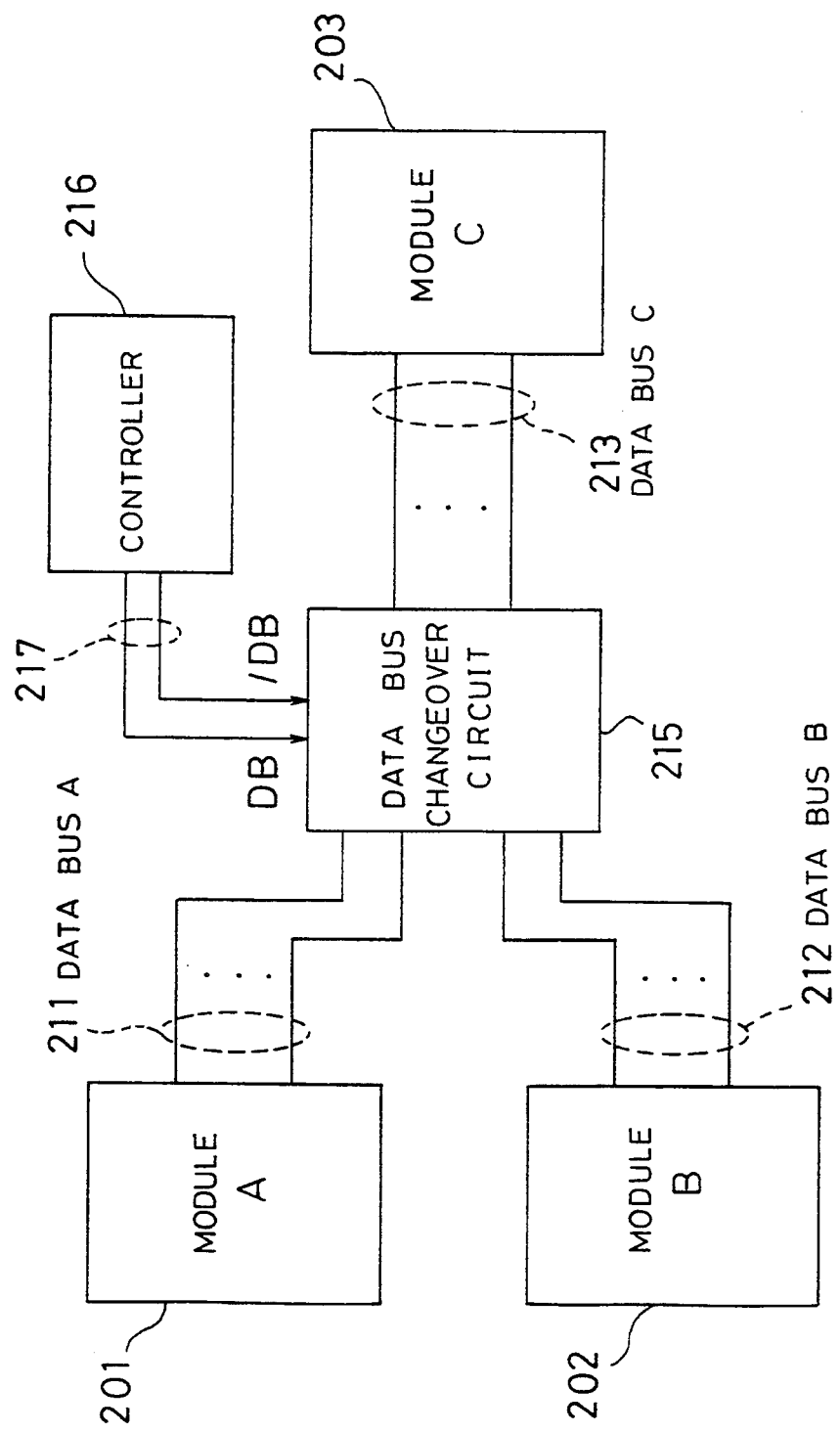
FIG. 14 is a block diagram illustrating the arrangement of data bus portions of a microprocessor serving as a semiconductor integrated circuit according to a fifth embodiment of the present invention.
Figure 15:
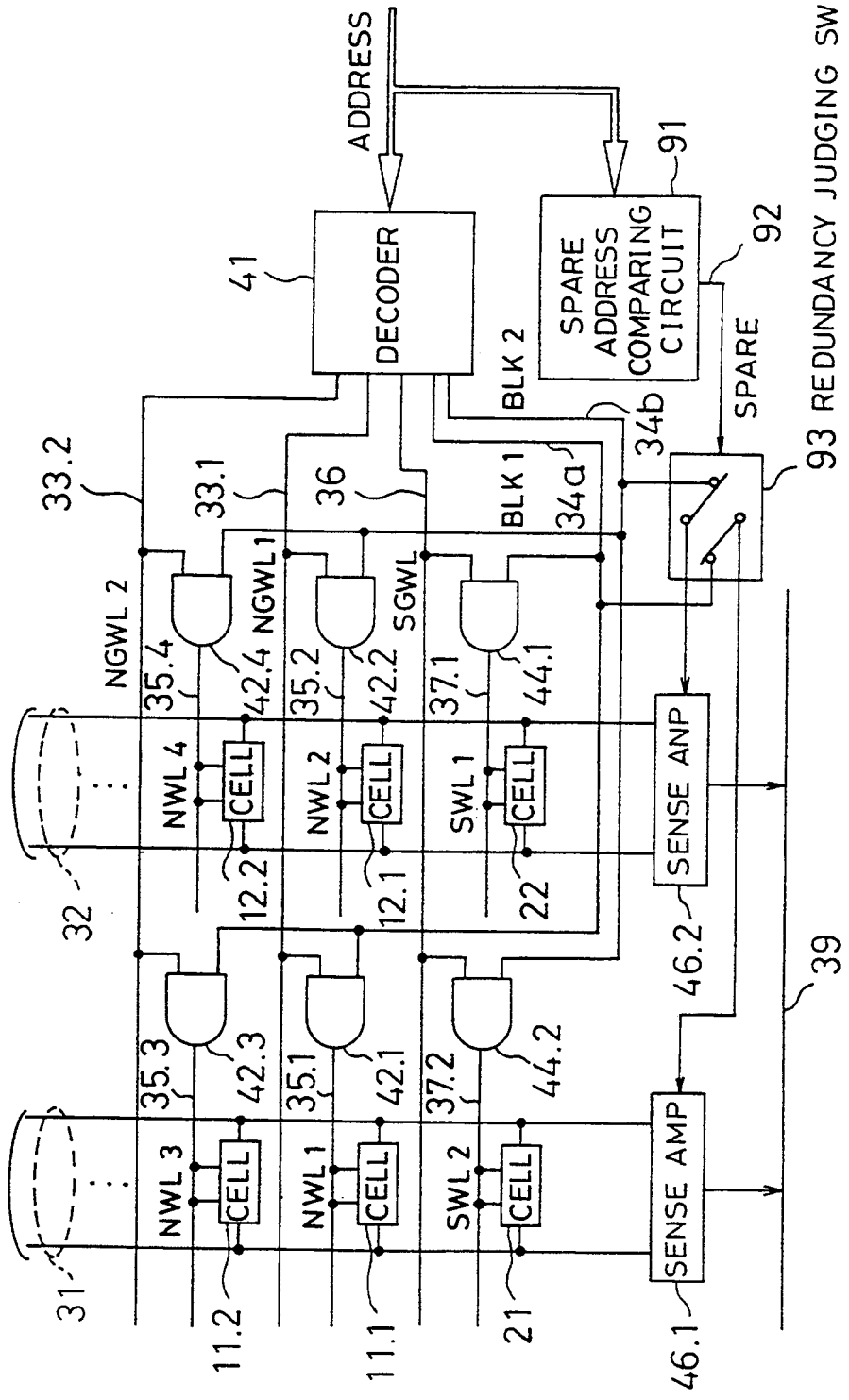
FIG. 15 is a circuit diagram illustrating the arrangement of a reading circuit portion of a conventional SRAM.
Figure 16:
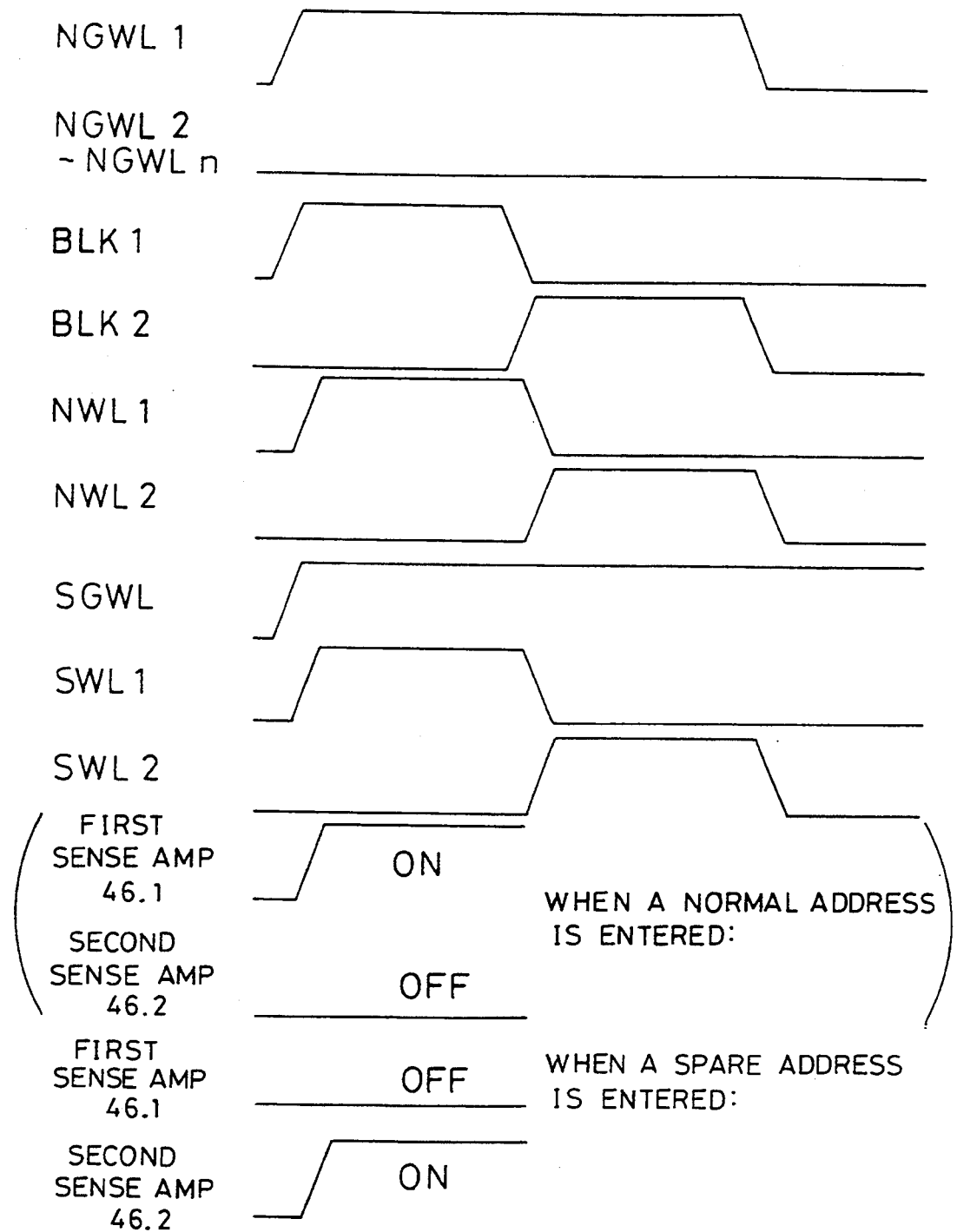
FIG. 16 is a diagram of operational waveforms of the reading circuit portion of the SRAM in FIG. 15.

FIG. 14 is a block diagram illustrating the arrangement of data bus portions of a microprocessor serving as a semiconductor integrated circuit according to a fifth embodiment of the present invention. This microprocessor is adapted such that a control signal for switching data buses is transmitted based on a difference in current.

In FIG. 14, there are shown first to third modules (A, B, C) 201 to 203 respectively having specific functions, and first to third data buses 211 to 213. A data bus changeover circuit 215 is a circuit block arranged such that data can be transmitted between the first module 201 and the third module 203 by connecting the first data bus 211 to the third data bus 213, or data can be transmitted between the second module 202 and the third module 203 by connecting the second data bus 212 to the third data bus 213. A control circuit 216 is adapted to supply control signals DB, /DB for switching data buses, to the data bus changeover circuit 215 through two complementary-signal transmitting lines 217. The control circuit 216 has the circuit arrangement shown in FIG. 6 or 8, and the data bus changeover circuit 215 has the circuit arrangement shown in FIG. 7.

According to the fifth embodiment, even though the wiring lengths of the complementary-signal transmitting lines 217 for transmitting the control signals DB, /DB to the data bus changeover circuit 215 in the microprocessor, are lengthened to increase the wiring capacitance, the control circuit 216 generates a difference in output impedance between the complementary-signal transmitting lines 217, enabling the control signals DB, /DB to be transmitted at a high speed with a small current.

We claim:

1. A semiconductor integrated circuit having a function of storing information, comprising:
   first and second data lines for reading out information;
   a first normal cell group and a first spare cell group commonly connected to said first data line such that information is read out onto said first data line;
   a second normal cell group and a second spare cell group commonly connected to said second data line such that information is read out onto said second data line;
   selecting amplifier means for selecting and amplifying either one of information on said first data line and information on said second data line;
   decoding means for supplying, according to an input address, either one of (i) a first block selecting signal for selecting said first normal cell group, and (ii) a second block selecting signal for selecting said second normal cell group, said decoding means being adapted to supply a normal global selecting signal for selecting one cell of said first normal cell group, or one cell of said second normal cell group;
   first switch means for controlling, based on said first or second block selecting signal and said normal global selecting signal supplied from said decoding means, such that information is read out onto said first data line from one cell of said first normal cell group when said first normal cell group is selected by said first block selecting signal, and that information is read out onto said second data line from one cell of said second normal cell group when said second normal cell group is selected by said second block selecting signal;

redundancy judging means for making a judgment of whether or not a plurality of stored spare addresses contain an address identical with said input address, said redundancy judging means being adapted to supply, according to said input address, a spare global selecting signal for selecting one cell of said first spare cell group or one cell of said second spare cell group only when said plurality of spare addresses contain said spare address identical with said input address, said redundancy judging means being adapted to designate, based on the result of said judgment, which information is to be amplified by said selecting amplifier means, out of information on said first data line and information on said second data line; and second switch means for controlling, based on said first or second block selecting signal supplied from said decoding means and said spare global selecting signal supplied from said redundancy judging means, such that information is read out onto said second data line from one cell of said second spare cell group when said first normal cell group is selected by said first block selecting signal, and that information is read out onto said first data line from one cell of said first spare cell group when said second normal cell group is selected by said second block selecting signal;

whereby said redundancy judging means is adapted such that, in the case said plurality of spare addresses do not contain said address identical with said input address, (i) said selecting amplifier means amplifies information on said first data line when said first normal cell group is selected by said first block selecting signal, and (ii) said selecting amplifier means amplifies information on said second data line when said second normal cell group is selected by said second block selecting signal, and said redundancy judging means is adapted such that, in the case said plurality of spare addresses contain said address identical with said input address, (i) said selecting amplifier means amplifies information on said second data line when said first normal cell group is selected by said first block selecting signal, and (ii) said selecting amplifier means amplifies information on said first data line when said second normal cell group is selected by said second block selecting signal.

2. A semiconductor integrated circuit according to claim 1, wherein the redundancy judging means comprises:
   a spare address comparing circuit for judging whether or not the plurality of stored spare addresses contain an address identical with the input address, and for supplying a coincidence signal, as selected from a plurality of coincidence signals, corresponding to said identical address when said plurality of stored spare addresses contain said identical address;
   a spare cell selecting circuit for supplying the spare global selecting signal according to said coincidence signal supplied from said spare address comparing circuit;
   a logical sum circuit for supplying a redundancy judging signal when said spare address comparing circuit supplies a coincidence signal; and
   a data-line changeover signal generating circuit for supplying a data-line changeover signal to switch the selecting operation of the selecting amplifier means according to said input address and said redundancy judging signal supplied from said logical sum circuit.

3. A semiconductor integrated circuit according to claim 2, wherein the selecting amplifier means comprises:
   a data-line changeover switch for selectively supplying either one of information on the first data line and information on the second data line;
   a switch driving circuit for switching the selecting operation of said data-line changeover switch according to the data-line changeover signal supplied from the data-line changeover signal generating circuit in the redundancy judging means; and
   an output amplifier for amplifying an output of said data-line changeover switch.

4. A semiconductor integrated circuit according to claim 3, wherein:
   the data-line changeover signal generating circuit comprises;
      two complementary-signal transmitting lines for transmitting data-line changeover signals to the switch driving circuit, and
      a variable impedance circuit adapted such that, when information on the first data line is selected by the data-line changeover switch, an output impedance to one of said two complementary-signal transmitting lines is higher than that to the other complementary-signal transmitting line, and such that, when information on the second data line is selected by said data-line changeover switch, said output impedance to said one complementary-signal transmitting line is lower than that to said other complementary-signal transmitting line; and
   the switch driving circuit comprises a current-detection-type amplifier for generating and detecting a difference in current between said two complementary-signal transmitting lines according to the difference between said output impedances to said two complementary-signal transmitting lines in said variable impedance circuit, said current-detection-type amplifier being adapted to convert said difference in current into a difference in potential such that the selecting operation of said data-line changeover switch is switched.

5. A semiconductor integrated circuit according to claim 4 wherein:
   the logical sum circuit comprises;
      a plurality of input MOSFETs having the same at-conduction impedance, said MOSFETs having (i) gates to which a coincidence signal is given from the spare address comparing circuit, said MOSFETs being conducted only when said coincidence signal is given to said gates, (ii) sources which are grounded and (iii) drains which are commonly connected to one another at the output point of said logical sum circuit, and
      a first impedance adjusting element having a constant impedance higher than said at-conduction impedance of said plurality of input MOSFETs, said element having one end which is connected to said output point, and the other end which is grounded;

the variable impedance circuit in the data-line changeover signal generating circuit has a second impedance adjusting element having a constant impedance equal to said at-conduction impedance of said plurality of input MOSFETs, said element having one end which is selectively connected to one of the two complementary-signal transmitting lines, and the other end which is grounded; and said output point of said logical sum circuit is selectively connected to the other complementary-signal transmitting line which is different from said one complementary-signal transmitting line to which said one end of said second impedance adjusting element is connected.

6. A semiconductor integrated circuit comprising:

two complementary-signal transmitting lines for signal transmission;

a variable impedance circuit adapted such that, in a first state, an output impedance to one of said two complementary-signal transmitting lines is higher than that to the other complementary-signal transmitting line, and that, in a second state, said output impedance to said one complementary-signal transmitting line is lower than that to said other complementary-signal transmitting line; and a current-detection-type amplifier for generating and detecting a difference in current between said two complementary-signal transmitting lines according to the difference between said output impedances to said two complementary-signal transmitting lines in said variable impedance circuit, s aid current-detection-type amplifier being adapted to convert said difference in current into a difference in potential.

7. A semiconductor integrated circuit according to claim 6, further comprising;

a plurality of input MOSFETs having the same at-conduction impedance, said MOSFETs having (i) gates to which an input signal is given, said MOSFETs being conducted only when said input signal is given to said gates, (ii) sources which are grounded, and (iii) drains which are commonly connected to one another at an output point, and a first impedance adjusting element having a constant impedance higher than said at-conduction impedance of said plurality of input MOSFETs, said element having one end which is connected to said output point, and the other end which is grounded;

the variable impedance circuit has a second impedance adjusting element having a constant impedance equal to said at-conduction impedance of said plurality of input MOSFETs, said element having one end which is selectively connected to one of the two complementary-signal transmitting lines, and the other end which is grounded; and said output point is selectively connected to the other complementary-signal transmitting line which is different from said one complementary-signal transmitting line to which said one end of said second impedance adjusting element is connected.

8. A semiconductor integrated circuit comprising:

two complementary-signal transmitting lines for signal transmission;

reference impedance generating means for generating, based on an input signal, a reference impedance as an output impedance to one of said two complementary-signal transmitting lines; and adjusting impedance generating means for generating, based on said input signal, an adjusting impedance having a difference from said reference impedance, said adjusting impedance being generated as an output impedance to the other complementary-signal transmitting line.

9. A semiconductor integrated circuit according to claim 8, wherein the adjusting impedance generating means comprises:

first means for generating a first adjusting impedance higher than the reference impedance;

second means for generating a second adjusting impedance lower than said reference impedance; and third means for selecting either one of said first and second adjusting impedances.

* * * * *